United States Patent
Hoffmann et al.

(10) Patent No.: US 6,212,053 B1
(45) Date of Patent: *Apr. 3, 2001

(54) DEVICE AND METHOD FOR DRIVING AT LEAST ONE CAPACITIVE ACTUATOR

(75) Inventors: Christian Hoffmann, Regensburg; Hellmut Freudenberg, Grossberg; Hartmut Gerken, Nittendorf; Martin Hecker, Laimerstadt; Richard Pirkl, Regensburg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/455,605

(22) Filed: Dec. 6, 1999

Related U.S. Application Data

(63) Continuation of application No. PCT/DE98/01361, filed on May 15, 1998.

(30) Foreign Application Priority Data

Jun. 6, 1997 (DE) .............................................. 197 23 935

(51) Int. Cl.[7] .................................................. H01H 47/00
(52) U.S. Cl. ........................ 361/169.1; 361/160; 361/115
(58) Field of Search ................................. 361/169.1, 115, 361/160

(56) References Cited

U.S. PATENT DOCUMENTS

| | | | |
|---|---|---|---|
| 4,688,536 | 8/1987 | Mitsuyasu et al. | 123/490 |
| 6,060,814 | * 5/2000 | Hoffmann et al. | 310/316.03 |
| 6,081,062 | * 6/2000 | Hoffmann et al. | 310/316.03 |

FOREIGN PATENT DOCUMENTS

| | | | |
|---|---|---|---|
| 3621541A1 | 1/1987 | (DE) | F02D/41/20 |
| 0464443A1 | 1/1992 | (EP) | F02D/41/40 |
| 0611881A1 | 8/1994 | (EP) | F02D/41/20 |
| 2533263 | 9/1982 | (FR) | F02D/5/02 |
| 9-112735 | 5/1997 | (JP) | F16K/31/06 |

* cited by examiner

*Primary Examiner*—Stephen W. Jackson
(74) *Attorney, Agent, or Firm*—Herbert L. Lerner; Laurence A. Greenberg; Werner H. Stemer

(57) ABSTRACT

The device drives one or more capacitive actuators with a control circuit. The device has a series circuit with a charging capacitor, a discharging capacitor, an electric coil, and the one or more actuators each with an associated selector switch. A discharging switch has a drain terminal connected to the node point between the two capacitors, and a source terminal connected via decoupling diodes to the drain terminals of the selector switches.

17 Claims, 1 Drawing Sheet

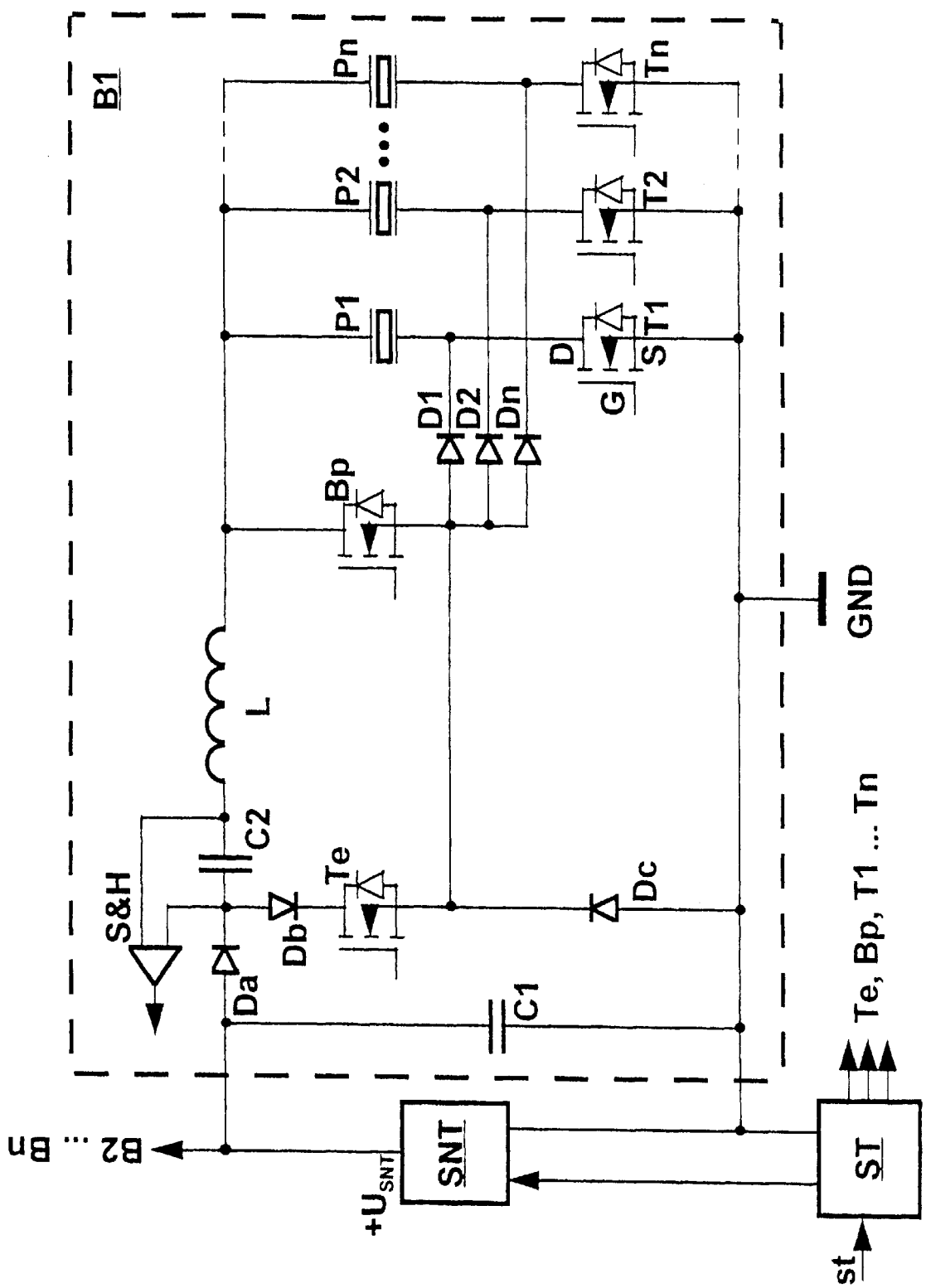

DEVICE AND METHOD FOR DRIVING AT LEAST ONE CAPACITIVE ACTUATOR

CROSS-REFERENCE TO RELATED APPLICATION

This is a continuation of copending International Application PCT/DE98/01361, filed May 15, 1998, which designated the United States.

BACKGROUND OF THE INVENTION

Field of the Invention

The invention relates to a device for driving at least one capacitive actuator, in particular an actuator of a fuel injection valve of a motor vehicle internal combustion engine. The device drives the capacitive actuator(s) by means of a control circuit. A charging capacitor is connected between the positive pole and the negative pole of a voltage source. A series circuit, connected in parallel with the charging capacitor, comprises a ring-around coil and at least one actuator with an assigned selector switch. The device further includes a discharging switch. The invention also relates to a method for operating the device.

A device of this type is disclosed in U.S. Pat. No. 4,688,536, entitled "drive circuit for an electrostrictive actuator in a fuel injection valve." There, use is made of thyristors for the charging or selector switch and a discharging switch. During the switch-on operation, thyristors must be triggered with a pulse, and are extinguished automatically when the power current flowing via them vanishes. The relatively long critical hold-off interval of the thyristors is problematical. This can be countered if the thyristors are replaced by MOSFET switches and diodes. However, a very complicated high-side drive circuit is required for N-MOSFET switches; it is certainly true that the drive circuit can be of simpler construction for P-MOSFET switches, but with these the losses are approximately twice as high as with N-MOSFET switches.

SUMMARY OF THE INVENTION

It is accordingly an object of the invention to provide a method and device for driving one or more capacitive actuators, which overcomes the above-mentioned disadvantages of the heretofore-known devices and methods of this general type and wherein the drive is as simple as possible. It is also the object of the invention to specify a method for operating the device.

With the foregoing and other objects in view there is provided, in accordance with the invention, a device for driving at least one capacitive actuator, comprising:

a control circuit;

a voltage source having a positive pole and a negative pole;

a charging capacitor connected between the positive pole and the negative pole of the voltage source;

a series circuit connected in parallel with the charging capacitor, the series circuit comprising a ring-around coil and at least one actuator with an assigned selector switch, at least one N-MOSFET selector switch having a source terminal connected to the negative pole of the voltage source and a drain terminal;

a discharging capacitor connected between the charging capacitor and the ring-around coil;

a measuring circuit connected to measure a voltage across the discharging capacitor and to relay the voltage to the control circuit;

a first diode having an anode connected to the positive pole and a cathode connected to the discharging capacitor for conducting current to the discharging capacitor;

a second diode having an anode connected to the cathode of the first diode and a cathode;

an N-MOSFET discharging switch having a drain terminal connected to the cathode of the second diode and a source terminal connected to the drain terminal of the selector switch via a decoupling diode; and a bypass device connected between a node between the ring-around coil and the actuator and the source terminal of the discharging switch.

In accordance with the invention, therefore, high-side charging switches (thyristors or MOSFET) are dispensed with, and the charging operations are triggered by selector switches that are referred to ground. The discharging circuit is not led via the frame terminal GND, in order to prevent an internal short circuit of the voltage source as a consequence of the missing charging switch when the discharging switch is on.

In accordance with an added feature of the invention, the bypass device is an N-MOSFET bypass switch controlled by the control unit, the bypass switch having a drain terminal connected to a node between the ring-around coil and the actuator and a source terminal connected to the source terminal of the discharging switch.

In an alternative embodiment, the bypass switch may be replaced with a diode or a Zener diode having a cathode connected to the ring-around coil.

In accordance with an additional feature of the invention, the voltage source is a switched-mode power supply connected to and controlled by the control unit.

In accordance with another feature of the invention, a further diode is connected to conduct current from the negative pole to the source terminal of the discharging switch.

In accordance with a further feature of the invention, the at least one actuator is one of a plurality of actuators each connected to a respective selector switch.

With the above and other objects in view there is also provided, in accordance with the invention, a method of operating the above-outlined device. The method comprises turning on the discharging switch when none of the selector switches is turned on.

In accordance with again an added feature of the invention, before a first operation of an actuator and between two actuator operations whose temporal spacing overshoots a prescribed duration, the discharging capacitor is charged by a least once simultaneously turning on the bypass switch and one of the selector switches and subsequently turning it off, until a voltage prescribed by the control unit is present across the discharging capacitor.

In accordance with again an additional feature of the invention, an actuator is operated until the associated selector switch is turned on.

In accordance with again another feature of the invention, the method comprises, during an operation of the device, controlling or regulating the output voltage of the voltage source to a constant charging voltage.

In accordance with again a further feature of the invention, the output voltage of the voltage source is controlled or regulated to a constant actuator voltage during an operation of the device.

In accordance with yet an added feature of the invention, the output voltage of the voltage source is controlled or regulated such that a constant charge is supplied to the respectively operated actuator or such that a constant energy is fed to the respectively operated actuator.

In accordance with yet an additional feature of the invention, the bypass switch is turned on when the actuator voltage overshoots a prescribed threshold value or when a switch fault occurs.

In accordance with a concomitant feature of the invention, the discharging switch is turned off when a current flowing through the drain-source path of the discharging switch overhoots a predetermined threshold value or when a voltage across the discharging switch exceeds a predetermined value.

Other features which are considered as characteristic for the invention are set forth in the appended claims.

Although the invention is illustrated and described herein as embodied in a device and method for driving at least one capacitive actuator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE is a circuit schematic of a drive circuit according to the invention.

DESCRIPTION OF THE PREFERRED EMBODIMENTS

Referring now to the sole FIGURE of the drawing in detail there is seen, inside a dashed box B1, a circuit for driving fuel injection valves of an internal combustion engine by means of capacitive actuators P1 to Pn. The circuit is supplied with power from a voltage source designed in the exemplary embodiment as a switched-mode power supply SNT, and controlled by the output signals of a control circuit ST which is fed control signals st from a microcomputer-controlled engine control unit. For bankwise control of the fuel injection, the circuit represented in the framed box B1 forms a bank; for each bank B2 to Bn, there is a need for a further such circuit which is connected in parallel with the circuit represented in the dashed box B1.

The circuit comprises a charging capacitor C1 which is connected in parallel with the switched-mode power supply SNT. Connected in parallel with the charging capacitor C1 is a series circuit comprising a discharging capacitor C2, a ring-around around coil L, a capacitive actuator P1 and a selector switch T1 assigned to the latter.

For each further fuel injection valve, a capacitor P2 to Pn is arranged in series with its selector switch T2 to Tn in parallel with the series circuit comprising the actuator P1 and the selector switch T1.

The switches Te and T1 to Tn located in the circuit are N-MOSFET switches via which current flows only in one direction.

Connected to the node between the two capacitors C1 and C2 is the drain terminal of a discharging switch Te whose source terminal is connected to the drain terminals of the selector switches T1 to Tn via decoupling diodes D1 to Dn. In order not to unnecessarily complicate the FIGURE, the drain D, the source S, and the gate G are drawn only for the selector switch T1.

There is also provided a bypass device which, in the illustrated embodiment, is a bypass switch Bp, whose drain terminal is connected to the node point between the ring-around coil L and the actuators P1 to Pn, and whose source terminal is connected to the source terminal of the discharging switch Te. All the switches are controlled via their gate terminals by the output signals of the control circuit ST.

The bypass switch Bp arranged in parallel with the actuators P1 to Pn is driven by the control circuit ST when the actuator voltage overshoots a prescribed threshold value, or when a fault occurring in the internal combustion engine up to the power output stages of the injection valves is detected, and discharges the capacitive actuators P1 to Pn in a short-circuiting manner. The bypass switch Bp is also required to charge or recharge the discharging capacitor C2. Instead of the bypass switch Bp, it is also possible to provide a diode or Zener diode of the same polarity as the inverse diode of the bypass switch, in which case the charging of the discharging capacitor C2 must be undertaken by actuator operation, preferably without fuel pressure in the case of a fuel injection valve.

Diodes Da and Db which are intended to prevent reverse currents are provided in the circuit. During charging, the diode Da prevents a reverse current of the negative component of the sinusoidal charging current into the voltage source, which would discharge the actuator. The diode Db prevents discharging of the discharging capacitor C2 via the inverse diode of the discharging switch Te both during the discharging operation (owing to the negative component of the sinusoidal discharging current) and in the case of a bypass switch Bp which is on.

A further diode Dc, which conducts current from the negative pole GND to the source terminal of the discharging switch Te, prevents negative voltages at the source terminals of the discharging switch Te and of the bypass switch Bp during the transition of one of the selector transistors T1 to Tn in the non-conducting state to the conducting state of the discharging switch Te or of the bypass switch Bp. This permits a simpler high-side drive of the discharging switch Te or of the bypass switch Bp.

The method of driving this circuit is described below. During operation of the circuit, the charging capacitor C1 is charged to the output voltage +USNT determined by the control circuit ST of the switched-mode power supply SNT.

At the start of operation, the discharging capacitor C2 is discharged and the ring-around coil L is de-energized. The first step is to turn on the bypass switch Bp and one of the selector switches T1 to Tn in order for the capacitor C2 to be completely charged before the first actuator operation. As a result, C1 is discharged via C2, L, Bp, and D1 and T1, for example. Bp and T1 are then turned off, and the discharging switch Te is now turned on. As a result, a current flows in the opposite direction through L, C2, Te and the inverse diode of the bypass switch Bp, as a result of which C2 is polarised in such a way that the total voltage $U_{C_1}+U_{C_2}$ (=charging voltage) is present across the series circuit of C1 and C2.

The voltage $U_{C2}$ across the capacitor C2 is communicated to the control circuit ST via a measuring circuit constructed in this exemplary embodiment as a sample-and-hold circuit S&H, and the operation is repeated until C2 is charged to a prescribed voltage $U_{C2}$.

Since the voltage $UC_2$ across the capacitor C2 drops slowly when there is no operation, such recharging of the discharging capacitor C2 is also undertaken during operation, for example during the charging operation at low speeds (that is to say, in the case of actuator operations which are further apart in time) or in over-running operation.

If an injection operation is to take place, the selector switch T1 assigned to the appropriate actuator, for example P1, is turned on. Current flows from +SNT and C1 via C2, L, P1 and T1 to GND, until the actuator is charged. The charge state of the actuator P1 is maintained as long as the selector switch T1 is on.

If T1 is turned off upon the disappearance of its control signal, and if no other selector switch T2 to Tn is on, that discharging switch Te is automatically turned on which is driven by the selector switches in a fashion inverted relative to them: if one of the selector switches T1 to Tn is on, the discharging switch Te is off, and vice versa.

In the case of the discharging switch Te which is on and if no actuator is operated, all the actuators P1 to Pn are discharged into the discharging capacitor C2 via the ring-around coil L, the discharging switch Te and the decoupling diodes D1 to Dn.

The voltage $U_{C2}$ subsequently present across the discharging capacitor C2 is communicated via the sample-and-hold circuit S&H to the control circuit ST which subsequently controls or regulates the output voltage of the switched-mode power supply SNT. This control or regulation can be performed either to a constant charging voltage $U_{C1}+U_{C2}$=const, to a constant actuator voltage Up=const or to a constant charge or energy fed to the actuator. The latter methods are described in our commonly assigned, copending applications Nos. 09/335,562 and 09/335,563. The charging operation of the next actuator can subsequently begin, etc.

In the case of external short circuiting of an actuator P1 to Pn which bridges the assigned selector switches T1 to Tn, short circuiting of the switched-mode power supply SNT would occur in the case of a discharging switch Te which is on. In order to avoid this, the drain-source voltage of the discharging switch Te, or the current flowing through it (by means of a shunt resistor) must be monitored by the control circuit and, in the event of a fault, the discharging switch Te must be turned off immediately.

We claim:

1. A device for driving at least one capacitive actuator, comprising:
    a control circuit;
    a voltage source having a positive pole and a negative pole;
    a charging capacitor connected between said positive pole and said negative pole of said voltage source;
    a series circuit connected in parallel with said charging capacitor, said series circuit comprising a ring-around coil and at least one actuator with an assigned selector switch, at least one N-MOSFET selector switch having a source terminal connected to said negative pole of said voltage source and a drain terminal;
    a discharging capacitor connected between said charging capacitor and said ring-around coil;
    a measuring circuit connected to measure a voltage across said discharging capacitor and to relay the voltage to said control circuit;
    a first diode having an anode connected to said positive pole and a cathode connected to said discharging capacitor for conducting current to said discharging capacitor;
    a second diode having an anode connected to said cathode of said first diode and a cathode;
    an N-MOSFET discharging switch having a drain terminal connected to said cathode of said second diode and a source terminal connected to said drain terminal of said selector switch via a decoupling diode; and
    a bypass device connected between a node between said ring-around coil and said actuator and said source terminal of said discharging switch.

2. The device according to claim 1, wherein said bypass device is an N-MOSFET bypass switch controlled by said control unit, said bypass switch having a drain terminal connected to a node between said ring-around coil and said actuator and a source terminal connected to said source terminal of said discharging switch.

3. The device according to claim 1, wherein said bypass device is a diode having a cathode connected to said ring-around coil.

4. The device according to claim 1, wherein said bypass device is a Zener diode having a cathode connected to said ring-around coil.

5. The device according to claim 1, wherein said voltage source is a switched-mode power supply connected to and controlled by said control unit.

6. The device according to claim 1, which comprises a further diode connected to conduct current from said negative pole to said source terminal of said discharging switch.

7. The device according to claim 1, wherein said actuator is one of a plurality of actuators each connected to a respective one of said selector switches.

8. A method of operating the device according to claim 1, which comprises turning on the discharging switch when none of the selector switches is turned on.

9. The method according to claim 8, which comprises, before a first operation of an actuator and between two actuator operations whose temporal spacing overshoots a prescribed duration, charging the discharging capacitor by a least once simultaneously turning on the bypass switch and one of the selector switches and subsequently turning it off, until a voltage prescribed by the control unit is present across the discharging capacitor.

10. The method according to claim 8, which comprises operating an actuator until the associated selector switch is turned on.

11. The method according to claim 8, which comprises, during an operation of the device, controlling or regulating the output voltage of the voltage source to a constant charging voltage.

12. The method according to claim 8, which comprises, during an operation of the device, controlling or regulating the output voltage of the voltage source to a constant actuator voltage.

13. The method according to claim 8, which comprises, during an operation of the device, controlling or regulating the output voltage of the voltage source such that a constant charge is supplied to the respectively operated actuator.

14. The method according to claim 8, which comprises, during an operation of the device, controlling or regulating the output voltage of the voltage source such that a constant energy is fed to the respectively operated actuator.

15. The method according to claim 8, which comprises turning on the bypass switch when the actuator voltage overshoots a prescribed threshold value or when a switch fault occurs.

16. The method according to claim 8, which comprises turning off the discharging switch when a current flowing through the drain-source path of the discharging switch overhoots a predetermined threshold value.

17. The method according to claim 8, which comprises turning off the discharging switch when a voltage across the discharging switch exceeds a predetermined value.

* * * * *